United States Patent
Blodgett

(10) Patent No.: US 6,910,152 B2
(45) Date of Patent: *Jun. 21, 2005

(54) DEVICE AND METHOD FOR REPAIRING A SEMICONDUCTOR MEMORY

(75) Inventor: Greg A. Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 546 days.

This patent is subject to a terminal disclaimer.

(21) Appl. No.: 09/932,403

(22) Filed: Aug. 17, 2001

(65) Prior Publication Data

US 2002/0019961 A1 Feb. 14, 2002

Related U.S. Application Data

(63) Continuation-in-part of application No. 09/796,080, filed on Feb. 28, 2001, which is a continuation of application No. 09/143,283, filed on Aug. 28, 1998, now Pat. No. 6,199,177.

(51) Int. Cl.[7] .................................................. G06F 11/00
(52) U.S. Cl. ........................................... 714/6; 711/134
(58) Field of Search .............................. 714/6, 7, 8, 27, 714/42, 5, 25, 30, 47, 54, 764; 711/133, 134, 103, 104

(56) References Cited

U.S. PATENT DOCUMENTS

| | | |
|---|---|---|
| 4,459,685 A | 7/1984 | Sud et al. |
| 4,601,019 A | 7/1986 | Shah et al. |
| 5,179,536 A | 1/1993 | Kasa et al. |
| 5,381,370 A | 1/1995 | Lacey et al. |
| 5,422,850 A | 6/1995 | Sukegawa et al. |
| 5,452,251 A | 9/1995 | Akaogi et al. |
| 5,513,144 A | 4/1996 | O'Toole |
| 5,523,975 A | 6/1996 | Reddy |
| 5,528,539 A | 6/1996 | Ong et al. |
| 5,548,225 A | 8/1996 | Rountree et al. |
| 5,576,633 A | 11/1996 | Rountree et al. |
| 5,594,693 A | 1/1997 | Rouy et al. |
| 5,604,702 A | 2/1997 | Tailliet |
| 5,648,934 A | 7/1997 | O'Toole |
| 5,684,740 A | 11/1997 | Hirata |
| 5,703,817 A | 12/1997 | Shiratake et al. |
| 5,706,292 A * | 1/1998 | Merritt ........................ 714/710 |
| 5,729,551 A | 3/1998 | Park et al. |
| 5,751,647 A | 5/1998 | O'Toole |
| 5,835,425 A * | 11/1998 | Berger ......................... 365/200 |
| 5,867,504 A * | 2/1999 | Pascucci ...................... 714/711 |
| 5,914,907 A | 6/1999 | Kobayashi et al. |
| 6,006,313 A | 12/1999 | Fukumoto |
| 6,018,811 A * | 1/2000 | Merritt ........................ 714/711 |
| 6,038,682 A | 3/2000 | Norman |
| 6,154,851 A | 11/2000 | Sher et al. |
| 6,199,177 B1 * | 3/2001 | Blodgett ........................ 714/7 |
| 6,282,670 B1 | 8/2001 | Rezaul Islam et al. |
| 6,571,352 B2 * | 5/2003 | Blodgett ......................... 714/6 |
| 2001/0016893 A1 * | 8/2001 | Merritt ........................... 711/1 |
| 2001/0044916 A1 * | 11/2001 | Blodgett ...................... 714/711 |
| 2002/0019961 A1 | 2/2002 | Blodgett |
| 2003/0154422 A1 * | 8/2003 | Blodgett ......................... 714/7 |
| 2004/0010737 A1 * | 1/2004 | Merritt ........................ 714/711 |

* cited by examiner

Primary Examiner—Nadeem Iqbal
(74) Attorney, Agent, or Firm—TraskBritt

(57) ABSTRACT

A block repair device is disclosed for use in a semiconductor memory having an array including a defective cell and a redundant row. The block repair device includes a set of fuses, antifuses, or flash EEPROM cells to store a block repair configuration that determines the dimensions (e.g., the number of rows and columns spanned) of a repair block used to repair the defective cell. Routing circuitry, such as multiplexer circuitry, in the block repair device is directed by the stored block repair configuration to output selected row and column address bits from received row and column addresses in a selected ratio. Comparison circuitry in the block repair device then compares the row and column address bits output by the routing circuitry with a stored portion of the address of the defective cell that defines the repair block. When a match occurs, the comparison circuitry implements a block repair by activating the redundant row and by causing data to be written to or read from the activated redundant row.

23 Claims, 6 Drawing Sheets

DEVICE AND METHOD FOR REPAIRING A SEMICONDUCTOR MEMORY

CROSS-REFERENCE TO RELATED APPLICATIONS

This is a continuation-in-part (CIP) application of U.S. patent application Ser. No. 09/796,080, filed Feb. 28, 2001, now U.S. Pat. No. 6,571,352 B2, issued May 27, 2003, which is a continuation of U.S. patent application Ser. No. 09/143,283, filed Aug. 28, 1998, issued Mar. 6, 2001, as U.S. Pat. No. 6,199,177 B1.

TECHNICAL FIELD

This invention relates in general to memory cell redundancy in semiconductor memories and, more particularly, to devices and methods for repairing semiconductor memories by replacing memory blocks that contain failing memory cells with redundant rows or columns of cells.

BACKGROUND OF THE INVENTION

Semiconductor memories generally include a multitude of memory cells arranged in rows and columns. Each memory cell is capable of storing digital information in the form of a "1" or a "0" bit. To write (i.e., store) a bit into a memory cell, a binary memory address having portions identifying the cell's row (the "row address") and column (the "column address") is provided to addressing circuitry in the semiconductor memory to activate the cell, and the bit is then supplied to the cell. Similarly, to read (i.e., retrieve) a bit from a memory cell, the cell is again activated using the cell's memory address, and the bit is then output from the cell.

Semiconductor memories are typically tested after they are fabricated to determine if they contain any failing memory cells (i.e., cells to which bits cannot be dependably written or from which bits cannot be dependably read). Generally, when a semiconductor memory is found to contain failing memory cells, an attempt is made to repair the memory by replacing the failing memory cells with redundant memory cells provided in redundant rows or columns in the memory.

Conventionally, when a redundant row is used to repair a semiconductor memory containing a failing memory cell, the failing cell's row address is permanently stored (typically in predecoded form) on a chip on which the semiconductor memory is fabricated by programming a nonvolatile element (e.g., a group of fuses, antifuses, or FLASH memory cells) on the chip. Then, during normal operation of the semiconductor memory, if the memory's addressing circuitry receives a memory address including a row address that corresponds to the row address stored on the chip, redundant circuitry in the memory causes a redundant memory cell in the redundant row to be accessed instead of the memory cell identified by the received memory address. Since every memory cell in the failing cell's row has the same row address, every cell in the failing cell's row, both operative and failing, is replaced by a redundant memory cell in the redundant row.

Similarly, when a redundant column is used to repair the semiconductor memory, the failing cell's column address is permanently stored (typically in predecoded form) on the chip by programming a nonvolatile element on the chip. Then, during normal operation of the semiconductor memory, if the memory's addressing circuitry receives a memory address including a column address that corresponds to the column address stored on the chip, redundant circuitry in the memory causes a redundant memory cell in the redundant column to be accessed instead of the memory cell identified by the received memory address. Since every memory cell in the failing cell's column has the same column address, every cell in the failing cell's column, both operative and failing, is replaced by a redundant memory cell in the redundant column.

Thus, for example, as shown in FIG. 1, a semiconductor memory 20 having failing memory cells 22, 24, 26, 28, 30, 32, 34, and 36 is repaired in the conventional manner described above using redundant rows 38, 40, and 42 and redundant columns 44, 46, and 48. As described above, the semiconductor memory 20 is repaired by replacing all memory cells in columns 50, 52, and 54, including failing memory cells 22, 24, 26, and 28, with redundant memory cells in redundant columns 44, 46, and 48. Further repairs to the semiconductor memory 20 are accomplished by replacing all memory cells in rows 56, 58, and 60, including failing memory cells 30, 32, 34, and 36, with redundant memory cells in redundant rows 38, 40, and 42. The process described above for repairing a semiconductor memory using redundant rows and columns is well known in the art, and is described in various forms in U.S. Pat. Nos. 4,459,685, 4,601,019, 5,422,850, and 5,528,539.

Unfortunately, it is difficult to provide enough redundant rows or columns in a semiconductor memory to repair all failing memory cells therein using the conventional repair process described above without using an excessive amount of space (commonly known as "real estate") in the memory for the redundant rows or columns. With the increasing size of semiconductor memories continuously increasing the need for redundancy, memory designers find themselves caught between providing sufficient redundancy to successfully repair most memories. As a result, memory designers are either using excessive space in the memories or providing insufficient redundancy to save space in the memories and, as a result, having to discard memories that are unrepairable. Obviously, neither alternative is desirable.

U.S. Pat. No. 5,548,225 to Rountree et al. discloses a repair system that, in contrast to the conventional repair system described above, does not use an entire redundant row or column to repair each defective memory cell in a semiconductor memory. In the Rountree repair system, the column address of a defective memory cell is stored using fuses in the same manner as described above. In addition, a partial row address common to a group of cells in the defective cell's column that includes the defective cell itself is also stored using fuses. When a memory address having column and row addresses that match the stored column address and stored partial row address is received, a redundant memory cell in a spare column is accessed. As a result, all of the cells in the group identified by the stored column address and stored partial row address are replaced by redundant cells in the spare column, while those cells in the defective cell's column not in the identified group are not replaced. Thus, the efficiency of repairs is increased by the Rountree system because only some of the redundant cells in the spare column are used to repair the defective cell, while other redundant cells remain in the spare column to repair other defective cells.

Unfortunately, the Rountree repair system can be problematic as well, because storing a full column address and a partial row address for every defective memory cell in need of repair requires a great deal of storage space (e.g., fuses, etc.). Consequently, the ever-increasing size of modern semiconductor memories, and the corresponding increase in the number of defective memory cells typically found, makes the Rountree repair system increasingly prohibitive to use because of the amount of storage space it requires.

Therefore, there is a need in the art for an improved device and method for repairing a semiconductor memory containing a failing memory cell. Such a device and method should replace the failing cell with a redundant memory cell without replacing the failing cell's entire row or column with the redundant cell's entire row or column. The device should also replace multiple failing cells in different rows or columns with redundant memory cells in a single redundant row or column in order to make more efficient use of redundant rows and columns, and should do so without the excessive need for storage space characteristic of the Rountree repair system.

SUMMARY OF THE INVENTION

A block repair device in accordance with the present invention is used in a semiconductor memory, such as a Static Random Access Memory (SRAM), having an array with a redundant row. The block repair device includes a set of nonvolatile elements, such as fuses, antifuses, or flash EEPROM cells, that store a block repair configuration that determines the dimensions (e.g., the number of rows and columns spanned) of the repair block used to repair the defective cell. Routing circuitry, such as multiplexer (mux) circuitry, in the block repair device is configured by the block repair configuration to output some received row and column address bits in a selected ratio. Comparison circuitry in the block repair device then compares the row and column address bits output by the routing circuitry with a stored portion of the address of the defective cell that defines the repair block. When a match occurs, the comparison circuitry implements a block repair by activating the redundant row and by causing data to be written to or read from the activated redundant row instead of the primary array.

The present invention thus provides an efficient device for implementing block repairs in a semiconductor memory. The device requires relatively few fuses or other nonvolatile elements to implement a repair, in contrast to the Rountree and other conventional methods described above.

In other embodiments of the invention, the block repair device described above is incorporated into a semiconductor memory, a semiconductor substrate such as a wafer, a SRAM, and an electronic system.

In a block repair method according to the present invention, a semiconductor memory having a primary array with a defective cell and a redundant row is repaired using a block repair. The dimensions of a repair block within the primary array for repairing the defective cell are first selected, and those row and column address bits of the defective cell that define the selected dimensions of the repair block are then stored using, for example, nonvolatile elements within the semiconductor memory. A block repair configuration that corresponds to the selected dimensions of the repair block is also stored using, for example, nonvolatile elements. Those received row and column address bits necessary to determine whether a received address falls within the repair block are then routed in accordance with the stored block repair configuration for comparison with the stored row and column address bits of the defective cell. When a match occurs, data is then written to, or read from, a cell within the redundant row selected in accordance with non-stored row and column address bits of the defective cell.

BRIEF DESCRIPTION OF THE DRAWING FIGURES

In the drawings, which illustrate what is currently regarded as the best mode for carrying out the invention and in which like reference numerals refer to like parts in different views or embodiments:

Figure 3:
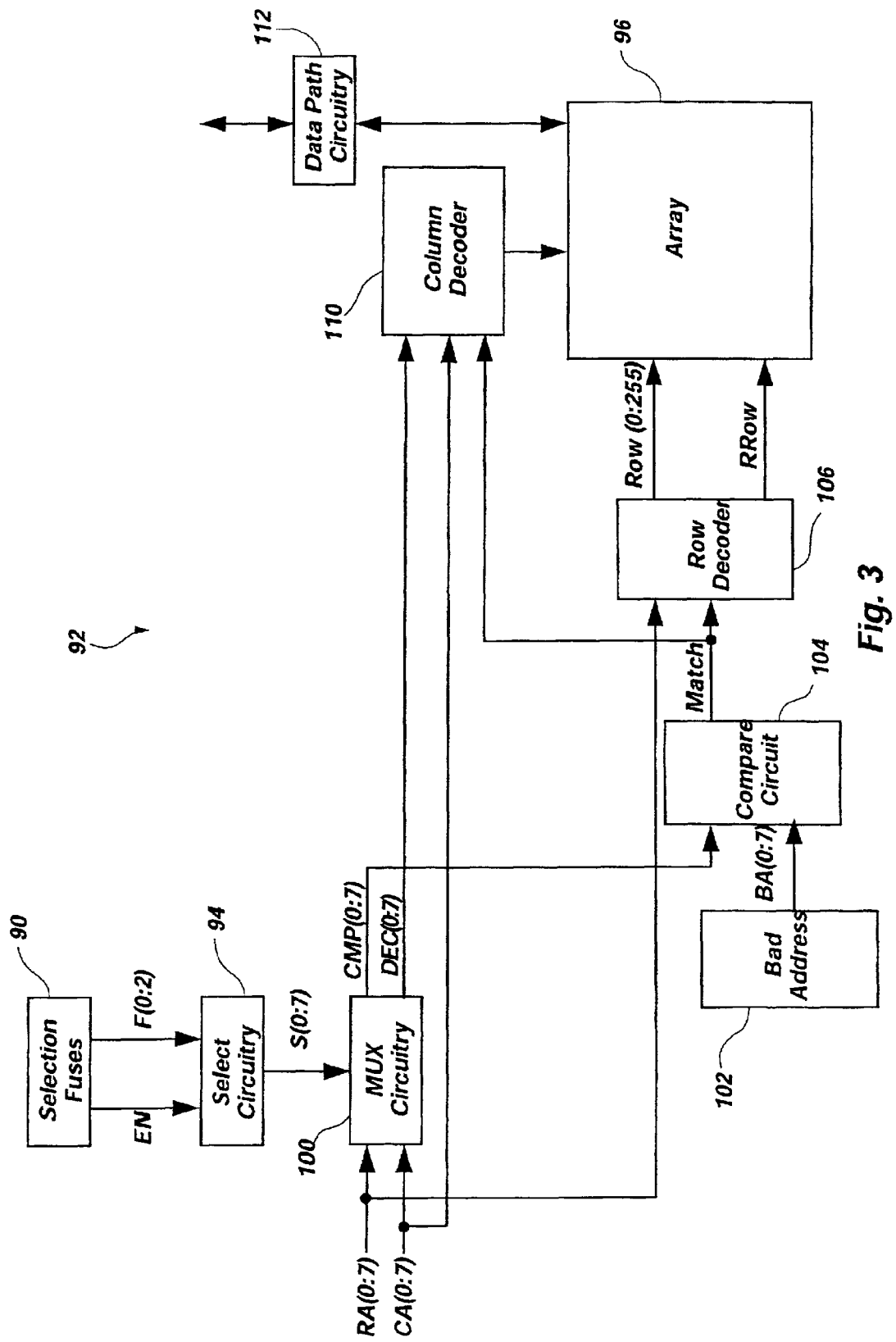
FIG. 3 is a block diagram showing a semiconductor memory in accordance with the present invention.
Figure 4A:
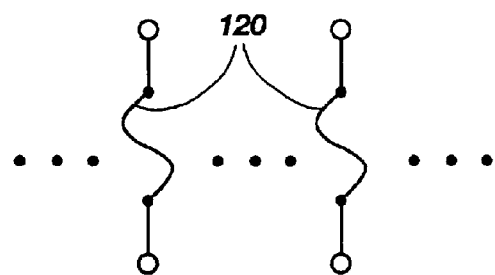
Figure 4B:
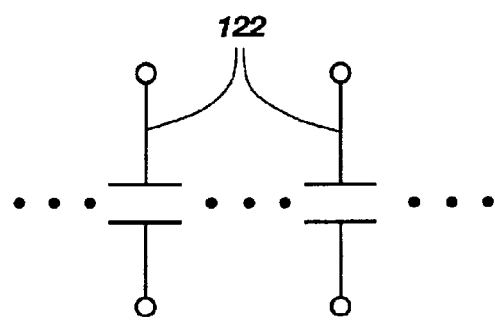
Figure 4C:
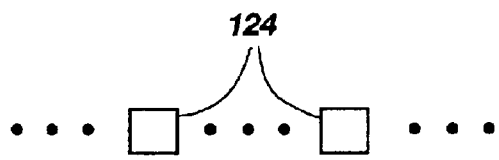

FIGS. 4A, 4B, and 4C are circuit schematics showing fuses, antifuses, and flash EEPROM cells capable of use as nonvolatile elements in the semiconductor memory of FIG. 3.

Figure 5:
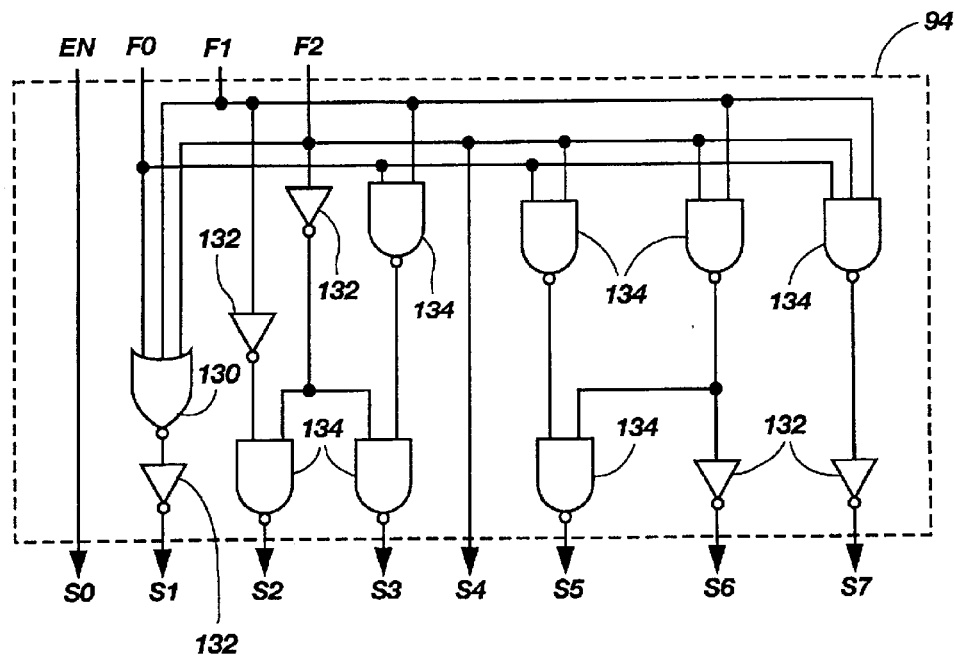

FIG. 5 is a circuit schematic showing select circuitry of the semiconductor memory of FIG. 3 in more detail.

Figure 6:
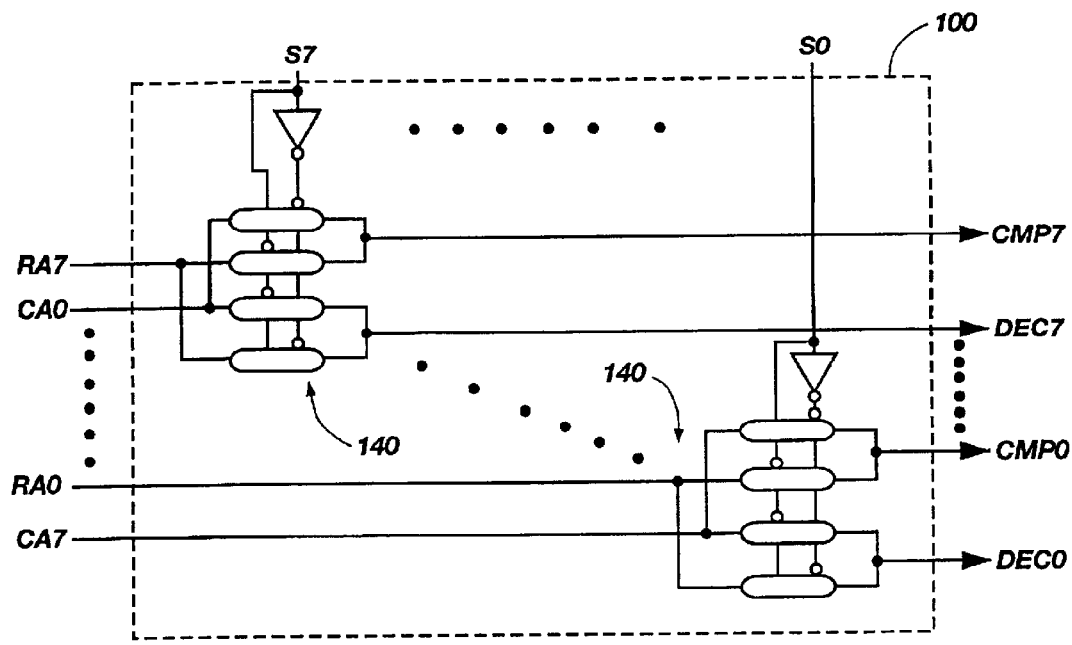

FIG. 6 is a circuit schematic showing mux circuitry of the semiconductor memory of FIG. 3 in more detail.

Figure 7:
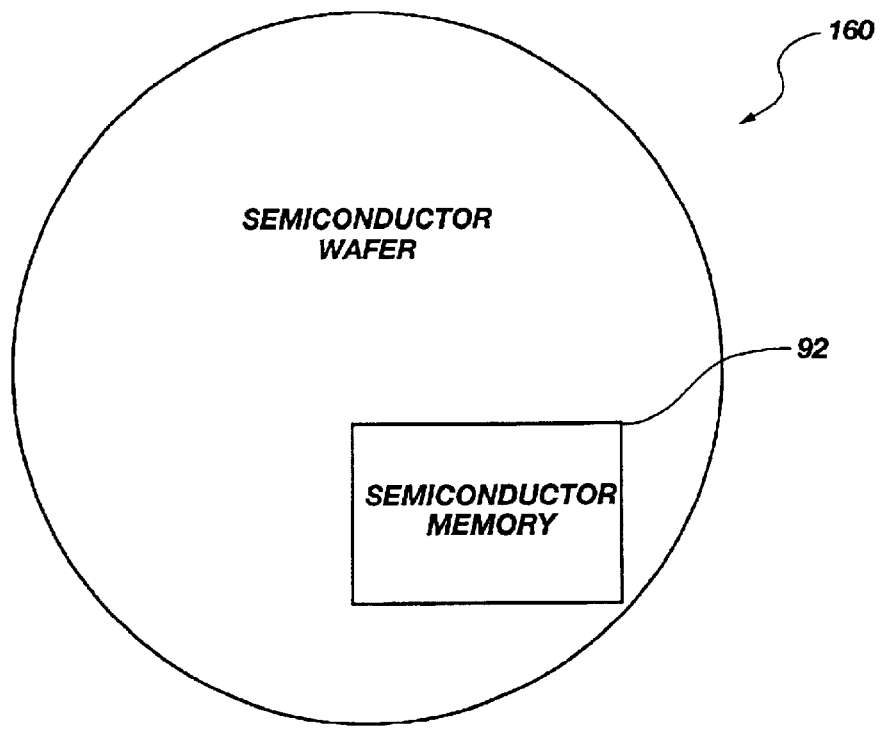

FIG. 7 is a diagram illustrating a semiconductor wafer on which the semiconductor memory of FIG. 3 is fabricated.

Figure 8:
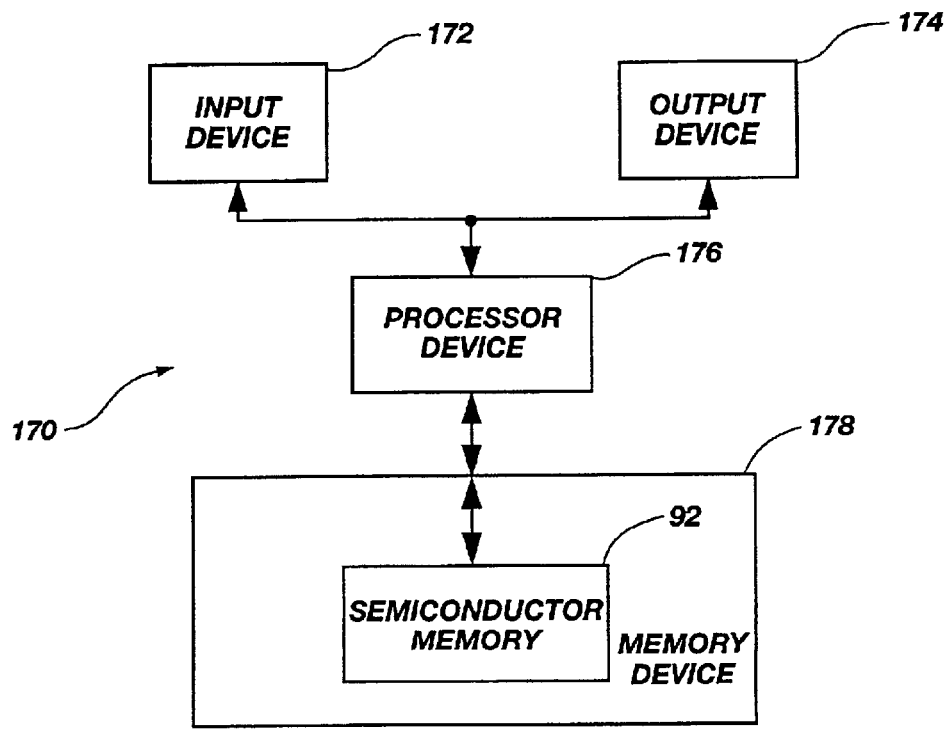

FIG. 8 is a block diagram of an electronic system incorporating the semiconductor memory of FIG. 3.

DETAILED DESCRIPTION OF THE INVENTION

Some general characteristics of the present invention will be described with respect to FIG. 2. This description will be followed by a detailed description of various embodiments of the present invention in connection with FIGS. 3–8.

Figure 1:
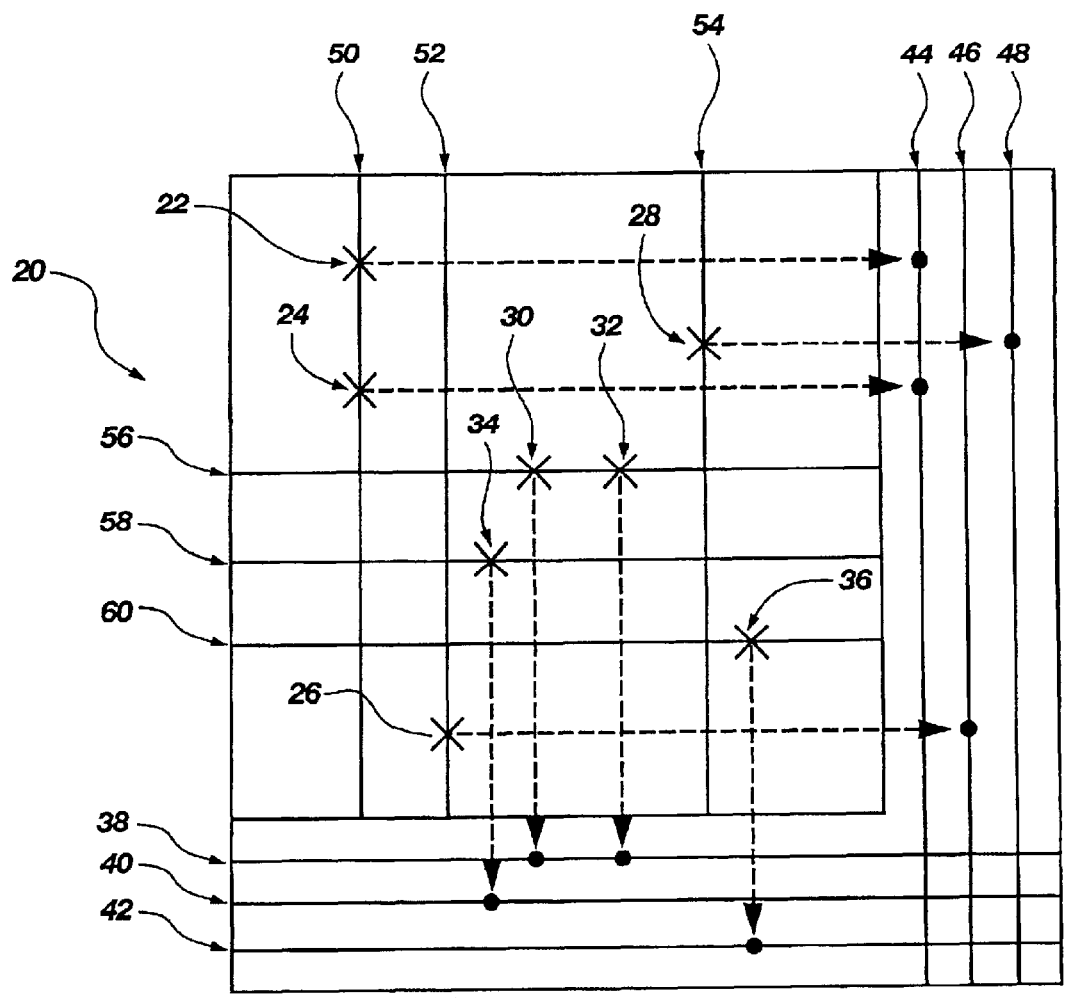
FIG. 1 is a prior art diagram illustrating conventional row and column redundancy in a semiconductor memory.
Figure 2:
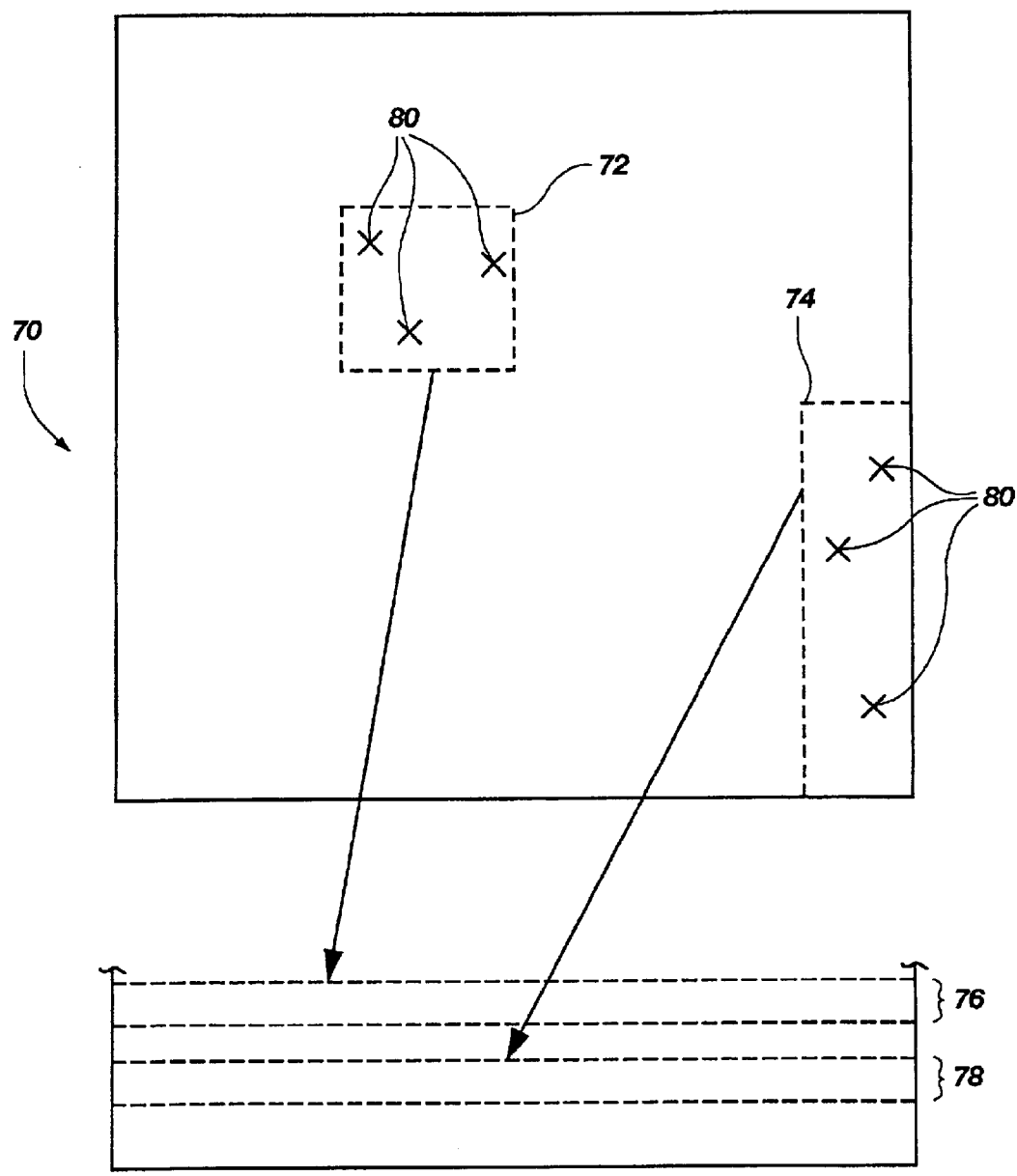
FIG. 2 is a diagram illustrating repair of a semiconductor memory in accordance with the present invention.

As shown in FIG. 2, a semiconductor memory 70 is repaired in accordance with the present invention by replacing memory blocks 72 and 74 with respective redundant rows 76 and 78. The position and dimensions (i.e., number of rows and columns spanned) of the memory blocks 72 and 74 are adjustable so an optimum number of defective memory cells 80 may be repaired using a minimum number of redundant rows. As a result, the present invention provides a highly efficient device and method for repairing a semiconductor memory. Also, the present invention provides such repair efficiency without the need for an excessive number of fuses which is characteristic of the Rountree repair system previously discussed.

As shown in FIG. 3, selection fuses 90 in a semiconductor memory 92 of the present invention may be programmed to output a block repair enable signal EN and fuse signals F(0:2) to select circuitry 94. When active, the block repair enable signal EN enables a block repair within an array 96 of the semiconductor memory 92 using a selected redundant row within the semiconductor memory 92. When inactive, the block repair enable signal EN enables conventional row repair within the array 96 using the selected redundant row. When block repair is enabled within the array 96, the status of the fuse signals F(0:2) determines the dimensions of the repaired block. Together, the fuse signals F(0:2) and the block repair enable signal EN may sometimes be referred to as a "block repair configuration."

It will be understood by those of ordinary skill in the art that only one enable signal EN and only one set of fuse signals F(0:2) are shown in FIG. 3 for purposes of clarity. In fact, redundant rows (e.g., rrow$_0$, rrow$_1$, rrow$_2$, etc.) typically each have their own enable signal (i.e., EN$_0$, EN$_1$, EN$_2$, etc.) and their own set of fuse signals (i.e., F$_0$(0:2), F$_1$(0:2), F$_2$(0:2), etc.) so that block repair or conventional repair can be selected for each redundant row using its enable signal, and so the dimensions of the repair block can be determined for each redundant row using its fuse signals if block repair is selected. For the purposes of this disclosure, rows and columns may be interchanged (i.e., instead of a redundant row, a redundant column may be used).

Although the present invention will be described with respect to a 64 KB memory, it will be understood by those of ordinary skill in the art that the invention is applicable to any size memory. Additionally, for the purposes of this detailed description, rows and columns may be interchanged (i.e., instead of a redundant row, a redundant column may be used.) It will also be understood that the invention is applicable to a wide variety of semiconductor memories, including, for example, magnetic random access memory (MRAM), dynamic RAM (DRAM), synchronous DRAM (SDRAM), double data rate SDRAM (DDR SDRAM), RAMBUS® DRAM (RDRAM®), extended data-out DRAM (EDO DRAM), fast-page-mode DRAM (FPM DRAM), static random access memory (SRAM), SyncBurst™ SRAM, Zero Bus Turnaround™ SRAM (ZBT™ SRAM, Quad Data Rate™ SRAM (QDR™ SRAM), DDR synchronous SRAM (DDR SRAM) and nonvolatile electrically block-erasable programmable read only memory (Flash). Further, it will be understood by those of ordinary skill in the art that any nonvolatile element (e.g., fuses, antifuses, or flash EEPROM cells) will work for purposes of the selection fuses 90, as will be explained in more detail below with respect to FIGS. 4A, 4B, and 4C.

Upon receiving the enable signal EN and the fuse signals F(0:2), the select circuitry 94 outputs selection signals S(0:7) as shown in Table 1 below.

TABLE 1

| EN | F2 | F1 | F0 | S7 | S6 | S5 | S4 | S3 | S2 | S1 | S0 | S(0:7) |
|----|----|----|----|----|----|----|----|----|----|----|----|--------|
| 0  | 0  | 0  | 0  | 0  | 0  | 0  | 0  | 0  | 0  | 0  | 0  | 0      |
| 1  | 0  | 0  | 0  | 0  | 0  | 0  | 0  | 0  | 0  | 0  | 1  | 1      |
| 1  | 0  | 0  | 1  | 0  | 0  | 0  | 0  | 0  | 0  | 1  | 1  | 3      |
| 1  | 0  | 1  | 0  | 0  | 0  | 0  | 0  | 0  | 1  | 1  | 1  | 7      |
| 1  | 0  | 1  | 1  | 0  | 0  | 0  | 0  | 1  | 1  | 1  | 1  | 15     |
| 1  | 1  | 0  | 0  | 0  | 0  | 0  | 1  | 1  | 1  | 1  | 1  | 31     |
| 1  | 1  | 0  | 1  | 0  | 0  | 1  | 1  | 1  | 1  | 1  | 1  | 63     |
| 1  | 1  | 1  | 0  | 0  | 1  | 1  | 1  | 1  | 1  | 1  | 1  | 127    |
| 1  | 1  | 1  | 1  | 1  | 1  | 1  | 1  | 1  | 1  | 1  | 1  | 255    |

Of course, it will be understood by one of ordinary skill in the art that although only one set of selection signals S(0:7) is discussed here, in fact each redundant row within the array 96 typically has an associated set of selection signals S(0:7).

In response to the selection signals S(0:7), and upon receiving row address signals RA(0:7) during a memory operation, mux circuitry 100 outputs compare signals CMP(0:7) as shown in Table 2, below.

TABLE 2

| S(0:7) | CMP7 | CMP6 | CMP5 | CMP4 | CMP3 | CMP2 | CMP1 | CMP0 |
|--------|------|------|------|------|------|------|------|------|
| 0      | RA7  | RA6  | RA5  | RA4  | RA3  | RA2  | RA1  | RA0  |
| 1      | RA7  | RA6  | RA5  | RA4  | RA3  | RA2  | RA1  | CA7  |
| 3      | RA7  | RA6  | RA5  | RA4  | RA3  | RA2  | CA6  | CA7  |
| 7      | RA7  | RA6  | RA5  | RA4  | RA3  | CA5  | CA6  | CA7  |
| 15     | RA7  | RA6  | RA5  | RA4  | CA4  | CA5  | CA6  | CA7  |
| 31     | RA7  | RA6  | RA5  | CA3  | CA4  | CA5  | CA6  | CA7  |
| 63     | RA7  | RA6  | CA2  | CA3  | CA4  | CA5  | CA6  | CA7  |
| 127    | RA7  | CA1  | CA2  | CA3  | CA4  | CA5  | CA6  | CA7  |
| 255    | CA0  | CA1  | CA2  | CA3  | CA4  | CA5  | CA6  | CA7  |

Thus, mux circuitry 100 passes the most significant bits of the row address RA(0:7) through in accordance with the selection signals S(0:7). As will be discussed below, this determines the "height" (i.e., the number of rows spanned) of a repair block. Thus, for example, with the selection signals S(0:7) all set to zero, the repair block has the height of a single row (because all bits of the row address RA(0:7) are passed through as compare signals CMP(0:7)). This only occurs when the repair block enable signal EN is inactive, so that conventional row repair is enabled. If, instead, the selection signals S(0:7) are set to fifteen, for example, then the repair block is sixteen rows high (because the four most significant bits of the row address RA(0:7) are passed through the mux circuitry 100). Finally, if the selection signals S(0:7) are set to two-hundred fifty-five, for example, then the repair block is two-hundred fifty-six rows high (i.e., the height of an entire column). Alternatively, the enable signal EN may be eliminated if one combination of fuse signals F(0:2) is used to decode the disable state (i.e., F(0:2) all unprogrammed can represent block repair disable). Then, one of the states of selection signals S(0:7) will not be available since there would only be seven remaining states of selection signals S(0:7) in the above example.

A portion of the address of a defective memory cell within the array 96 is stored using bad address storage fuses 102 (hereinafter "fuses 102") and is output by the fuses 102 as bad address BA(0:7). If, for example, conventional row repair is being used to repair the defective memory cell, then the fuses 102 are programmed to output a bad address BA(0:7) equivalent to the row address of the defective cell. If, instead, a repair block sixteen rows high, for example, is being used to repair the defective cell, then the fuses 102 are programmed so the four most significant bits of the bad address (i.e., BA7, BA6, BA5, and BA4) match the four most significant bits of the row address of the defective cell, and so the four least significant bits of the bad address (i.e., BA3, BA2, BA1, and BA0) match the four most significant bits of the column address of the defective cell (for reasons that will be explained below). Finally, if the repair block used to repair the defective cell is an entire column within the array 96, then none of the fuses 102 are programmed with bits from the row address of the defective memory cell. Instead, the fuses 102 are programmed with the column address of the defective memory cell (again, for reasons that will be explained below).

Of course, it will be understood by one of ordinary skill in the art that each redundant row in the array 96 typically has its own associated bad address BA(0:7). Only one is discussed here for purposes of clarity. Also, it will be understood that the fuses 102 may comprise any nonvolatile element including, for example, fuses, antifuses, or flash EEPROM cells, as will be discussed below with respect to FIGS. 4A, 4B, and 4C.

The compare signals CMP(0:7) also include the column address CA(0:7) as shown in Table 2. The compare circuitry 104 compares the compare signals CMP(0:7) to the bad address BA(0:7). If there is no match, the column address CA(0:7) is used to select a column of the array 96 and the row decoder 106 selects a row address. When a match occurs, a column is selected by a column decoder 110 in accordance with redundant decode signals DEC(0:7) that are output by the mux circuitry 100 as shown in Table 3, below.

TABLE 3

| S(0:7) | DEC7 | DEC6 | DEC5 | DEC4 | DEC3 | DEC2 | DEC1 | DEC0 |
|---|---|---|---|---|---|---|---|---|
| 0 | CA0 | CA1 | CA2 | CA3 | CA4 | CA5 | CA6 | CA7 |
| 1 | CA0 | CA1 | CA2 | CA3 | CA4 | CA5 | CA6 | RA0 |
| 3 | CA0 | CA1 | CA2 | CA3 | CA4 | CA5 | RA1 | RA0 |
| 7 | CA0 | CA1 | CA2 | CA3 | CA4 | RA2 | RA1 | RA0 |
| 15 | CA0 | CA1 | CA2 | CA3 | RA3 | RA2 | RA1 | RA0 |
| 31 | CA0 | CA1 | CA2 | RA4 | RA3 | RA2 | RA1 | RA0 |
| 63 | CA0 | CA1 | RA5 | RA4 | RA3 | RA2 | RA1 | RA0 |
| 127 | CA0 | RA6 | RA5 | RA4 | RA3 | RA2 | RA1 | RA0 |
| 255 | RA7 | RA6 | RA5 | RA4 | RA3 | RA2 | RA1 | RA0 |

The selection fuses 90 and the bad address storage fuses 102 of FIG. 3 may comprise any nonvolatile elements including, for example, fuses 120 as shown in FIG. 4A, antifuses 122 as shown in FIG. 4B, and flash EEPROM cells 124 as shown in FIG. 4C.

As shown in FIG. 5, the select circuitry 94 of FIG. 3 includes a NOR gate 130, inverters 132, and NAND gates 134 for implementing the operations of the select circuitry 94 as described above with respect to Table 1. Of course, it will be understood by one of ordinary skill in the art that any device for selecting the height and width of a repair block will work for purposes of the present invention, and that such a device need not necessarily include the circuitry shown in FIG. 5 or operate in accordance with Table 1.

As shown in FIG. 6, the mux circuitry 100 includes a plurality of mux circuits 140 for implementing the operations of the mux circuitry 100 as described above with respect to Tables 2, 3, and 4. Again, it should be understood that any device for routing the proper row and column addresses to the compare circuitry 104 (see FIG. 3) will work for purposes of the present invention, and that such a device need not necessarily operate in accordance with Tables 2 and 3.

It should be noted that, as described thus far, the present invention only uses repair blocks that stay within "logical" boundaries of the array 96 of FIG. 3. In addition, a repair block that spans one quarter of the rows in the top half of the array 96, for example, and one quarter of the rows in the bottom half can be implemented using an alternative embodiment described below.

In this embodiment, repair blocks that cross logical boundaries within the array 96 of FIG. 3 may be used. For example, a repair block that spans an odd number of rows in the top half of the array 96 and an even number of rows in the bottom half of the array 96 can be implemented using this embodiment. Such an embodiment typically requires that additional bad address storage fuses 102 (see FIG. 3) be provided to store additional bits from the row and column addresses of a defective memory cell. These additional bits are typically necessary to identify a match when row and column addresses are received. Such an embodiment also typically requires that the compare circuitry 104 (see FIG. 3) be constructed to perform the necessary logical operations to determine a match. This embodiment thus requires additional fuses or other nonvolatile elements, but provides greater flexibility in selecting the optimum location of repair blocks.

In the specific example described, the row address Most Significant Bit (MSB) may be replaced with an XOR function of the MSB and the next lower row address term for the repair address match. Likewise, logical combinations of column address terms may be used in place of single column address terms to "shift" or split the repair block in the column dimension. For example, replacing the column MSB with an XAND function of the two most significant column address bits will split the repair block and match upper and lower quarters of the column address space rather than upper or lower halves.

As shown in FIG. 7, the semiconductor memory 92 of FIG. 3 is fabricated on a semiconductor wafer 160. It should be understood that the semiconductor memory 92 may also be fabricated on a wide variety of other semiconductor substrates including, for example, a Silicon-On-Insulator (SOI) substrate, a Silicon-On-Glass (SOG) substrate, and a Silicon-On-Sapphire (SOS) substrate.

As shown in FIG. 8, an electronic system 170 includes an input device 172, an output device 174, a processor device 176, and a memory device 178 that incorporates the semiconductor memory 92 of FIG. 3. Of course, it should be understood that the semiconductor memory 92 may also be incorporated into any one of the input device 172, the output device 174, and the processor device 176.

Although the present invention has been described with reference to particular embodiments, the invention is not limited to these described embodiments. Rather, the invention is limited only by the appended claims, which include within their scope all equivalent devices or methods that operate according to the principles of the invention as described herein.

What is claimed is:

1. A semiconductor memory comprising:

an array including a redundant row;

a first set of nonvolatile elements for storing at least a portion of an address of a defective cell of said array;

data path circuitry coupled to said array for writing data thereto and reading data therefrom;

a second set of nonvolatile elements for storing a block repair configuration;

routing circuitry coupled to said second set of nonvolatile elements capable of being configured by a stored block repair configuration to output a selected ratio of received row address bits to received column address bits; and comparison circuitry coupled to said first set of nonvolatile elements, said data path circuitry, and said routing circuitry for comparing row and column address bits output by said routing circuitry with said stored at least a portion of said defective cell address and, when a match occurs, for implementing a block repair of said defective cell by activating said redundant row and directing said data path circuitry to write data to or read data from said activated redundant row.

2. The semiconductor memory of claim 1, wherein said array is a magnetic random access memory (MRAM) array, dynamic RAM (DRAM) array, synchronous DRAM (SDRAM) array, double data rate SDRAM (DDR SDRAM) array, RAMBUS® DRAM (RDRAM®) array, extended data-out DRAM (EDO DRAM) array, fast-page-mode DRAM (FPM DRAM) array, static random access memory (SRAM) array, SyncBurst™ SRAM array, Zero Bus Turn-around™ SRAM (ZBTT™ SRAM) array, Quad Data Rate™ SRAM (QDR™ SRAM) array, DDR synchronous SRAM (DDR SRAM) array or nonvolatile electrically block-erasable programmable read only memory (Flash) array.

3. The semiconductor memory of claim 1, wherein said first and second sets of nonvolatile elements include at least one of fuses, antifuses, and flash EEPROM cells.

4. The semiconductor memory of claim 1, wherein said first set of nonvolatile elements comprises nonvolatile elements for storing at least a portion of a row address and at least a portion of a column address of said defective cell.

5. The semiconductor memory of claim 1, wherein said routing circuitry comprises select circuitry and multiplexer (mux) circuitry.

6. The semiconductor memory of claim 5, wherein said select circuitry comprises inverters, NOR gates, and NAND gates, and wherein said mux circuitry comprises multiplexers and inverters.

7. The semiconductor memory of claim 1, wherein said second set of nonvolatile elements includes a block repair enabling nonvolatile element for enabling block repairs when active and disabling block repairs, and thereby enabling conventional row repairs, when inactive.

8. The semiconductor memory of claim 7, wherein said first set of nonvolatile elements stores only row address bits of said defective cell.

9. The semiconductor memory of claim 1, wherein said comparison circuitry comprises circuitry for implementing a block repair that does not cross logical boundaries within said array.

10. A Static Random Access Memory (SRAM) comprising:
a SRAM array including a redundant row;
bad address storage fuses for storing at least a portion of an address of a defective cell of said SRAM array;
data path circuitry coupled to said SRAM array for writing data thereto and reading data therefrom;
row and column decoders coupled to said SRAM array for selecting cells therein in accordance with received row and column addresses;
selection fuses for storing a block repair configuration;
selection and multiplexer (mux) circuitry coupled to said selection fuses capable of being configured by a stored block repair configuration to output a selected ratio of received row address bits to received column address bits; and
comparison circuitry coupled to said bad address storage fuses, said row and column decoders, and said selection and mux circuitry for comparing row and column address bits output by said selection and mux circuitry with said stored at least a portion of said defective cell address and, when a match occurs, for implementing a block repair of said defective cell by activating said redundant row and by directing said data path circuitry to write data to or read data from said activated redundant row.

11. A block repair device for a semiconductor memory having an array including a redundant row, said block repair device comprising:
a set of nonvolatile elements for storing a block repair configuration;
routing circuitry coupled to said set of nonvolatile elements capable of being configured by a stored block repair configuration to output a selected ratio of received row address bits to received column address bits; and
comparison circuitry coupled to said routing circuitry for comparing row and column address bits output by said routing circuitry with a stored portion of an address of a defective cell of said array and, when a match occurs, for implementing a block repair of said defective cell by activating said redundant row and causing data to be written to or read from said activated redundant row of said array.

12. A semiconductor substrate on which is fabricated a semiconductor memory comprising:
an array including a redundant row;
a first set of nonvolatile elements for storing at least a portion of an address of a defective cell of said array;
data path circuitry coupled to said array for writing data thereto and reading data therefrom;
a second set of nonvolatile elements for storing a block repair configuration;
routing circuitry coupled to said second set of nonvolatile elements capable of being configured by a stored block repair configuration to output a selected ratio of received row address bits to received column address bits; and
comparison circuitry coupled to said first set of nonvolatile elements, said data path circuitry, and said routing circuitry for comparing row and column address bits output by said routing circuitry with said stored at least a portion of said defective cell address and, when a match occurs, for implementing a block repair of said defective cell by activating said redundant row and directing said data path circuitry to write data to or read data from said activated redundant row within said array.

13. The semiconductor substrate of claim 12, wherein said semiconductor substrate comprises a semiconductor wafer.

14. An electronic system comprising an input device, an output device, a memory device, and a processor device coupled to said input device, said output device, and said memory device, at least one of said input device, said output device, said memory device, and said processor device including a semiconductor memory, comprising:
an array including a redundant row;
a first set of nonvolatile elements for storing at least a portion of an address of a defective cell of said array;
data path circuitry coupled to said array for writing data thereto and reading data therefrom;
a second set of nonvolatile elements for storing a block repair configuration;
routing circuitry coupled to said second set of nonvolatile elements capable of being configured by a stored block repair configuration to output a selected ratio of received row address bits to received column address bits; and
comparison circuitry coupled to said first set of nonvolatile elements, and said routing circuitry for comparing row and column address bits output by said routing circuitry with said stored at least a portion of said defective cell address and, when a match occurs, for implementing a block repair of said defective cell by activating said redundant row and directing said data path circuitry to write data to or read data from said activated redundant row of said array.

15. A block repair method for a semiconductor memory having an array including a defective cell and a redundant row, said block repair method comprising:
   selecting dimensions of a repair block within said array for repairing said defective cell;
   programming nonvolatile elements within said semiconductor memory to store row and column address bits of said defective cell defining said selected dimensions of said repair block;
   programming other nonvolatile elements within said semiconductor memory to store a block repair configuration corresponding to said selected dimensions of said repair block;
   in accordance with said stored block repair configuration, routing received row and column address bits to determine whether a received address falls within said repair block for comparison with said stored row and column address bits of said defective cell; and
   when a match occurs, firing said redundant row and writing data to or reading data from a cell within said redundant row selected in accordance with said row and column address bits of said defective cell not stored by said nonvolatile elements.

16. The block repair method of claim 15, wherein said programming nonvolatile elements comprises programming nonvolatile elements comprising at least one of fuses, antifuses, and flash EEPROM cells.

17. The block repair method of claim 15, wherein said programming other nonvolatile elements comprises programming other nonvolatile elements comprising at least one of fuses, antifuses, and flash EEPROM cells.

18. A block repair method for a semiconductor memory having an array including a defective cell and a redundant row, said block repair method comprising:
   selecting dimensions of a repair block within said array for repairing said defective cell;
   storing row and column address bits of said defective cell defining said selected dimensions of said repair block;
   storing a block repair configuration corresponding to said selected dimensions of said repair block;
   in accordance with said stored block repair configuration, routing received row and column address bits to determine whether a received address falls within said repair block for comparison with said stored row and column address bits of said defective cell; and
   when a match occurs, firing said redundant row and writing data to or reading data from a cell within said redundant row selected in accordance with any non-stored row and column address bits of said defective cell.

19. The block repair method of claim 18, wherein said storing row and column address bits and said storing a block repair configuration comprise programming nonvolatile elements comprising at least one of fuses, antifuses, and flash EEPROM cells.

20. The block repair method of claim 18, wherein said routing received row and column address bits comprises multiplexing received row and column address bits in accordance with said block repair configuration.

21. The block repair method of claim 18, wherein said storing a block repair configuration includes programming a nonvolatile element to enable block repair with respect to said redundant row.

22. The block repair method of claim 18, wherein said storing a block repair configuration includes programming a nonvolatile element to disable block repair with respect to said redundant row and thereby enable conventional row repair using said redundant row.

23. The block repair method of claim 18, wherein said storing row and column address bits of said defective cell defining said selected dimensions of said repair block comprises storing only row address bits of said defective cell.

* * * * *

UNITED STATES PATENT AND TRADEMARK OFFICE
CERTIFICATE OF CORRECTION

PATENT NO. : 6,910,152 B2 Page 1 of 1
APPLICATION NO. : 09/932403
DATED : June 21, 2005
INVENTOR(S) : Greg A. Blodgett It is certified that error appears in the above-identified patent and that said Letters Patent is hereby corrected as shown below:

COLUMN 9, LINE 12, change "(ZBTT™ SRAM)" to --(ZBT™ SRAM)--

Signed and Sealed this

Sixth Day of November, 2007

JON W. DUDAS
*Director of the United States Patent and Trademark Office*